(12) United States Patent
Surico et al.

(10) Patent No.: US 7,181,565 B2
(45) Date of Patent: Feb. 20, 2007

(54) METHOD AND SYSTEM FOR CONFIGURING PARAMETERS FOR FLASH MEMORY

(75) Inventors: Stefano Surico, Milan (IT); Simone Bartoli, Cambiago (IT); Mirella Marsella, Taranto (IT); Giorgio Bosisio, Robbiate (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/272,206

(22) Filed: Nov. 10, 2005

(65) Prior Publication Data

US 2006/0253644 A1    Nov. 9, 2006

(30) Foreign Application Priority Data

May 3, 2005    (IT) .......................... MI2005A0799

(51) Int. Cl.
*G06F 12/00* (2006.01)
(52) U.S. Cl. .................................... 711/103
(58) Field of Classification Search ................ 711/103, 711/154
See application file for complete search history.

(56) References Cited

U.S. PATENT DOCUMENTS

| | | | |
|---|---|---|---|
| 6,327,552 B2 | 12/2001 | Nemani et al. | |
| 6,330,185 B1 | 12/2001 | Wong et al. | |
| 6,341,085 B1 | 1/2002 | Yamagami et al. | |
| 6,347,051 B2 | 2/2002 | Yamagami et al. | |
| 6,396,744 B1 | 5/2002 | Wong | |
| 6,549,482 B2 | 4/2003 | Garner | |
| 6,567,334 B2 | 5/2003 | Yamagami et al. | |
| 6,662,314 B1 | 12/2003 | Iwata et al. | |
| 6,671,785 B2 | 12/2003 | Dalvi et al. | |
| 6,721,843 B1 | 4/2004 | Estakhri | |
| 6,907,496 B2* | 6/2005 | Langford et al. ........... | 711/103 |
| 2001/0032067 A1 | 10/2001 | Nemani et al. | |
| 2002/0040992 A1 | 4/2002 | Manabe et al. | |
| 2002/0136078 A1 | 9/2002 | Garner | |
| 2002/0144103 A1* | 10/2002 | Kendall ..................... | 713/1 |
| 2002/0153555 A1 | 10/2002 | Manabe et al. | |
| 2003/0208343 A1 | 11/2003 | Baez | |
| 2003/0229482 A1 | 12/2003 | Cook et al. | |
| 2004/0049628 A1 | 3/2004 | Lin et al. | |
| 2005/0086456 A1* | 4/2005 | Elboim et al. .............. | 713/1 |
| 2005/0280072 A1* | 12/2005 | Naso et al. ................ | 257/314 |

* cited by examiner

*Primary Examiner*—Kevin L. Ellis
(74) *Attorney, Agent, or Firm*—Sawyer Law Group LLP

(57) ABSTRACT

Method and system for configuring parameters used in flash memory devices. A load instruction and associated address are retrieved from a read-only memory, and the address is used to select a configuration register storing a configuration value. The configuration value is loaded to an associated dedicated register to configure a parameter of the flash memory in a flash memory operation. In another aspect, one or more selected configuration values not stored in a ROM are changed if a tested flash memory operation is not within desired specifications.

27 Claims, 4 Drawing Sheets

METHOD AND SYSTEM FOR CONFIGURING PARAMETERS FOR FLASH MEMORY

FIELD OF THE INVENTION

The present invention relates to flash memory devices, and more particularly to the configuring of parameters used in flash memory devices.

BACKGROUND OF THE INVENTION

Flash memory devices are used in a wide variety of electronic devices. A flash memory device offers non-volatile storage of data, and also conveniently allows the data to be programmed into the memory and erased from the memory multiple times, thus allowing a multitude of flexible applications.

A flash memory device performs all its embedded operations based on the generation and control of many design parameters, such as analog signals, maximum values, timings, etc. The values of these parameters depend on digital information stored in a series of dedicated registers in the flash memory that are associated with these parameters. Recent flash memory devices have their operations, such as program and erase operations, handled by a process implemented by program instructions stored in a read-only memory (ROM) and executed by a microcontroller. For example, a user can send a program or erase command to a flash memory system via a Command User Interface (CUI) to implement the corresponding program or erase flash memory operation. The command is interpreted by the microcontroller, and specific signals are then generated to control the digital hardware of the flash memory device in order to perform the requested flash memory operation.

Embedded operations in a flash memory device are complex, especially with regard to the generation and control of parameters such as critical analog signals, which have a very large range of values and various possible values, and require very fine control. These analog signals have to be properly initialized and, from time to time, updated in the various phases of the operation in order to have perfect control of the full operation. Examples of critical configured values based on analog signals include the start values of the cell gate voltage during a program operation, the start value of the cell source or bulk voltage during an erase operation, and the cell gate voltage value during a verify operation. These signals are obtained by regulating involved hardware charge pumps, and this regulation follows the desired configurations specified by the provided digital configuration values in the current phase of the ongoing operation.

All of the needed configurations for each analog signal in each operation phase are obtained by loading the corresponding digital information (values) into the associated dedicated registers. In many existing flash memories, the digital information is loaded into the dedicated registers through a direct load instruction having a format of an opcode, which is the command indicating that it is a load instruction, followed by an operand, which is the configuration value to load in the associated dedicated register.

However, this approach tends not to be very flexible. For example, in new technology devices that are in continuous development, the effective values of specific parameter signals are only estimated by referring to current process data, and then the device is simulated with the estimated values. The results of the simulation are then compared with data resulting from actual measurements performed during a debugging procedure of the memory device. As a result of the comparison, the values of particular signals, and thus the configuration values that determine these signals, may be changed during the debugging procedure or following the process development if the performance of the system is not within desired specifications.

If a change in a given configuration occurs, two possible methods are typically used: a change in the ROM process code is made to change the configuration values, and/or the configuration values are changed using configuration fuses. The first method, a change in the ROM process code, includes changing the configuration value of the instruction programmed in the ROM. The instruction written in the ROM includes a direct operand, i.e., the configuration digital value is part of the instruction. Thus, in the event of a change in the value, new masks must be requested for the ROM. This solution has evident negative consequences in terms of design flexibility, since it has additional costs and has increased time to obtain new silicon for the ROM.

The second method allows hardware fuses to change configuration values. However, the evaluation of configuration fuses must be performed by the configuration process implemented by the ROM instructions. Typically, in each phase of an ongoing flash memory operation, the process has to determine whether a condition set by a configuration fuse is verified (using a compare (CMP) condition). If the condition set by a fuse is verified, the process executes the proper "LOAD data" instruction stored in the ROM in order to load the correct configuration value into the dedicated register. Thus, the process code is longer and more complex because each load of a configuration value requires the use of an additional CMP instruction to check a fuse condition, and therefore many additional CMP and jump (JMP) instructions are needed. The code loses generality because loading values directly depends on the value of particular configuration fuses. Further, a significant drawback in this method is that the execution of additional instructions requires additional time. This drawback is particularly serious if the involved code branch is continuously repeated during the execution of the process code. Time-saving methods must be emphasized, if possible, especially during complex operations which take a significant amount of time to be completely executed and which must respect fixed timing requirements.

Accordingly, what is needed is an apparatus or method for configuring flash memory parameters that is more flexible and time-efficient. The present invention addresses such a need.

SUMMARY OF THE INVENTION

The invention of the present application relates to the configuration of parameters used in flash memory devices. In one aspect of the invention, a method for configuring parameters for a flash memory includes retrieving a load instruction and associated address from a read-only memory, using the address to select a configuration register storing a configuration value, and loading the configuration value to a dedicated register to configure an associated parameter of the flash memory in a flash memory operation.

In another aspect of the invention, a system for configuring parameters for a flash memory includes a microcontroller, a read-only memory (ROM) storing addresses, dedicated registers, and a flash memory array including programmable memory locations. Each of the ROM addresses points to a configuration register storing a configuration value. To configure a parameter of the flash memory in a flash memory operation, one of the configuration values is loaded into one of the dedicated registers, where the loaded configuration value is from a configuration register pointed to by a particular one of the addresses stored in the read-only memory, the particular address associated with the parameter.

In another aspect of the invention, a method for testing parameters for a flash memory operation includes selecting configuration registers not provided in a ROM device, where the selected configuration registers each store a selected configuration value. The selected configuration values are loaded to dedicated registers to configure associated parameters of the flash memory in a flash memory operation. It is determined whether the flash memory operation is within desired specifications, and at least one of the selected configuration values is changed if the flash memory operation is not within desired specifications.

The present invention provides an architecture that introduces a high level of configurability for main parameters used in flash memory devices. Configurations of all the dynamically changing design parameters are handled without affecting process code stored in the ROM. The invention thus allows higher flexibility in the design and continuous process development of the flash memory device, and does not require ROM memory mask changes for any change of the configurations. The invention also provides simplicity and generality to the process code, and compacts the ROM process code since comparisons of fuse values and related jump instructions are not needed. This allows considerable time savings during the execution of complex flash memory operations, where efficient architecture allows configuration parameters to be easily accessed during these operations.

DETAILED DESCRIPTION

The present invention relates to flash memory devices, and more particularly to the configuring of parameters used in flash memory devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is mainly described in terms of particular systems provided in particular implementations. However, one of ordinary skill in the art will readily recognize that this method and system will operate effectively in other implementations. For example, the processing systems and output devices usable with the present invention can take a number of different forms. The present invention will also be described in the context of particular methods having certain steps. However, the method and system operate effectively for other methods having different and/or additional steps not inconsistent with the present invention.

The present invention describes an architecture which introduces a high level of configurability in the dedicated registers and associated design parameters of a flash memory device. The dedicated registers are dynamically loaded with the digital information selected from a set of configuration values properly multiplexed (switched to the dedicated registers) by a microcontroller during a flash memory operation. This method allows a reduction in complexity over prior art implementations and increases the flexibility of the process and code stored in read-only memory by compacting the load instruction process and avoiding the use of many conditional jump instructions. In this way, the flash memory device has improved performance during the execution of very complex operations, more simplicity and generality is provided to the implementation, and flexibility is provided to the design in an environment of continuous process development and device specification changes following debugging of the flash memory device.

To more particularly describe the features of the present invention, please refer to FIGS. 1 through 4 in conjunction with the discussion below.

Figure 1:
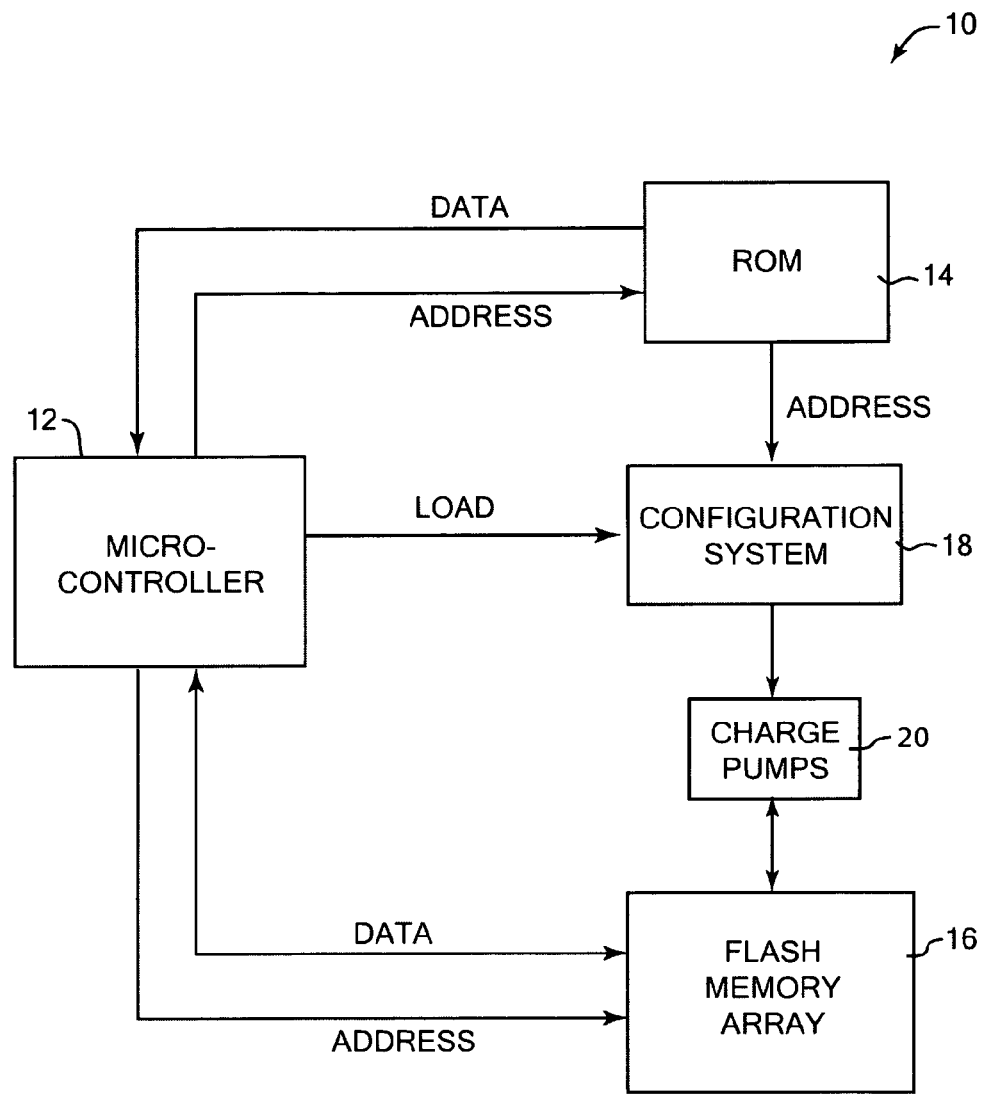
FIG. 1 is a block diagram illustrating a flash memory system suitable for use with the present invention.

FIG. 1 is a block diagram of a flash memory system 10 suitable for use with the present invention. Flash memory system 10 can be included in an electronic device, computer, or other device or apparatus which uses flash memory for storing data. Such a device, for example, can include one or more processors (microprocessors, application specific integrated circuits, etc.), various types of memory, and input/output (I/O) components (network interface, devices such as a keyboard or buttons, display screen, printer, mouse, microphone, scanner, etc.), as is well known.

In the described embodiment, the system 10 is a self-contained flash memory device 10 (e.g., package) that internally includes the depicted components, including a microcontroller 12, a read-only memory (ROM) 14, flash memory array 16, and a configuration system 18. In alternate embodiments, some components of the flash memory system 10 can be provided externally, such as microcontroller 12.

Microcontroller 12 is provided to control operations of the flash memory system 10, to send addresses and retrieve data from the ROM 14, and to store and retrieve data from the flash memory array 16. The microcontroller 12 can be any of a variety of suitable controller devices, including microprocessors, application specific integrated circuits (ASICs), or other circuits or controllers.

ROM 14 stores program instructions (i.e., code) which are used to implement operations that modify or manipulate the flash memory system 10. The ROM 14 stores load instructions which are used to load needed configuration values into dedicated registers of the flash memory system to set analog conditions for flash memory operations, and also stores code instructions to implement steps and functions of these operations. Herein, the term "read-only memory" or "ROM" can refer to standard read-only memory, or any type of memory in which data written to the memory cannot be erased without an extensive process including replacing the memory device or portions thereof, or removing the memory device from the system 10 for erasing and/or reprogramming, or replacement. In a typical implementation, the ROM 14 typically can be written to only once, so that the values stored in the ROM cannot be overwritten or erased. To change the values in the ROM, a new ROM mask must typically be created and a new ROM circuit made and installed in the system 10.

Flash memory array 16 includes non-volatile memory locations or cells that are fully programmable, i.e., the cells can store data and allows that data to be erased and/or written over with other data numerous times. A typical flash memory array allows the entire contents of the memory to be quickly erased at one time, as opposed to more general electrically erasable programmable read-only memory (EE-PROM) that allows each memory cell to be individually erased.

Charge pumps 20 are coupled to the flash memory array 16 and are regulated to provide voltage signals to the array 16. These voltage signals control particular voltages needed during flash memory operations of the array 16. For example, the cell gate voltage during a program operation, the cell source or bulk voltage during an erase operation, and the cell gate voltage during a verify operation are provided by the charge pumps 20.

A configuration system 18 of the present invention is coupled to coupled to microcontroller 12 and to ROM 14. When the microcontroller 12 reads a LOAD instruction from ROM 14, the microcontroller sends the LOAD opcode to system 18 to configure a parameter of the flash memory array 16. The LOAD opcode instructs the system 18 to retrieve the operand for that LOAD instruction, an address, from the ROM 14. System 18 includes a number of dedicated registers that are used to control parameters of operations of the array 16 according to digital configuration values loaded into the dedicated registers and which are appropriate to a particular current phase of a flash memory operation. Each dedicated register is associated with a particular design parameter that is used in an ongoing operation of the flash memory system. For example, a dedicated register can be associated with a parameter that is an analog device signal (a voltage or current), or dedicated registers can be used to configure parameters such as timings, start values, maximum values, maximum number of operations, or other parameters of the flash memory system 10. The LOAD address from ROM 14 is used to load a configuration value from a configuration register into an appropriate dedicated register.

When a configuration value is loaded into a particular dedicated register in configuration system 18, the associated parameter of the flash memory array 16 is initialized or updated. The system 18 sends out a "dedicated value" (a loaded configuration value) from the dedicated register to charge pumps 20 or to another component of system 10 to control the associated parameter and operation of the flash memory array 16.

For example, a configuration value loaded in a dedicated register can set the start values of the cell gate voltage during a program operation for the flash memory array 16; another configuration value and associated dedicated register can set the start value of the cell source or bulk voltage during an erase operation of the flash memory array 16; and a different configuration value and dedicated register can set the cell gate voltage value during a verify operation of the array 16. These voltage signals are obtained by system 18 sending loaded configuration values (dedicated values) to charge pumps 20 to regulate these charge pumps. Charge pumps are controlled according to values appropriate to a particular current phase of the flash memory operation as is well known to those of skill in the art. Other dedicated registers can control parameters of flash memory array 16 not related to voltages, currents, or charge pumps 20, and thus dedicated values derived from these dedicated registers are sent to other registers or components (not shown) of the flash memory system 10, as is well known to those of skill in the art. The operation of the configuration system 18 is described in greater detail below with respect to FIGS. 2–4.

Figure 2:
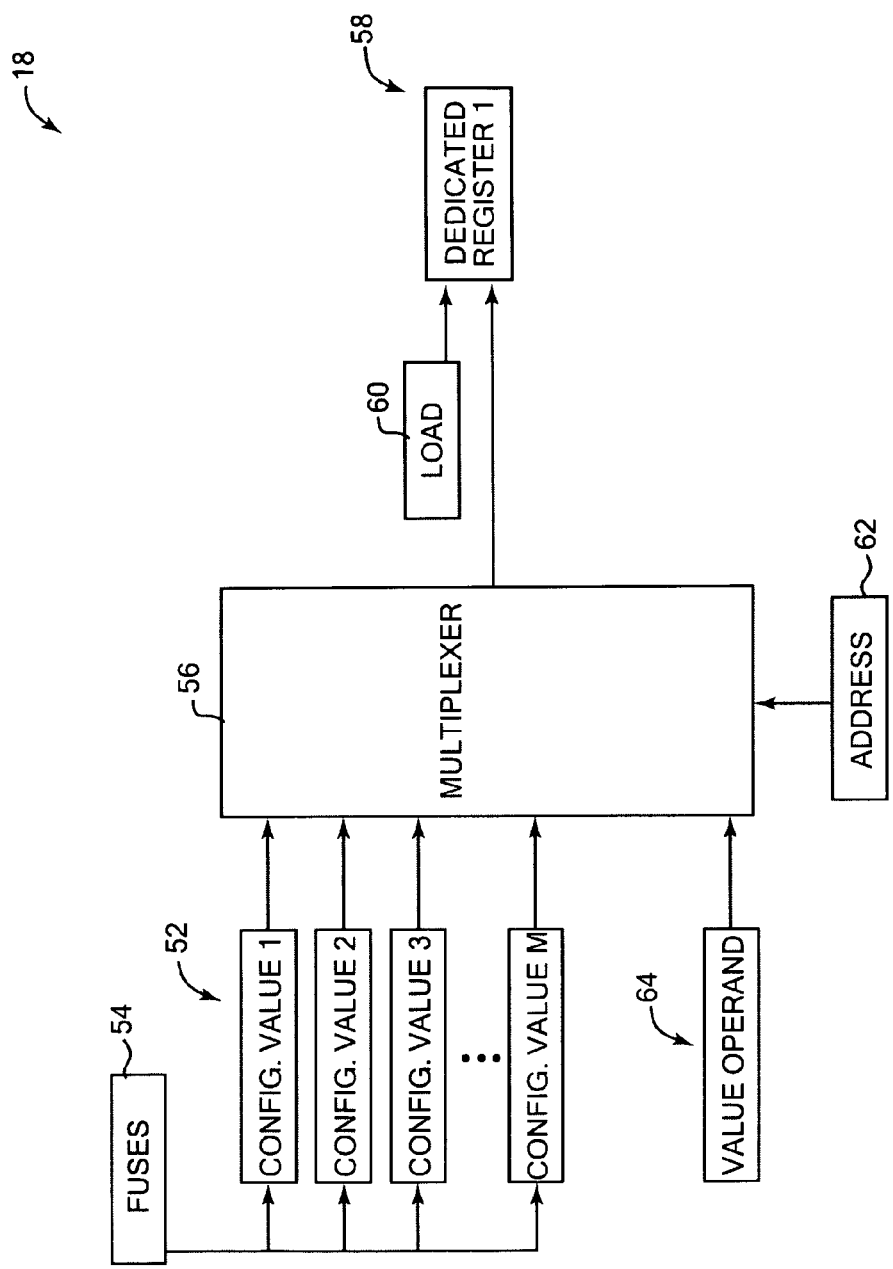
FIG. 2 is a block diagram illustrating the functionality of the present invention for configuring flash memory parameters.

FIG. 2 is a functional block diagram illustrating the functional operation of the configuration system 18 in the flash memory system 10 of the present invention for loading configuration values dynamically into dedicated registers of the flash memory system. In the preferred embodiment, the blocks of system 18 are implemented using hardware components. Configuration system 18 includes configuration registers 52, fuses 54, a multiplexer 56, and dedicated register(s) 58.

Configuration registers 52 store configuration values that are available to be loaded into the dedicated registers 58 to set and/or adjust parameters of the flash memory array 16. The configuration registers 52 can be any available registers, memory locations, or other storage locations not provided in ROM 14, and preferably in a storage area that allows their stored values to be easily erased or changed during testing of the flash memory system 10. In the described embodiment, the configuration registers are provided separately from the other memories. Alternatively, the configuration registers can be provided in the non-volatile, erasable array cells 16 of the flash memory, or in some other memory of the flash device (preferably erasable, to allow full configurability of the default configuration values stored in registers 52, although this may not be necessary in some embodiments of the invention). In the described embodiment, configuration values loaded into the dedicated registers 58 can also be changed by combining default values in configuration registers 52 with mask values from the fuses 54, as described below.

According to the present invention, each dedicated register 58 of the system is associated with all possible configuration values that are needed to configure that dedicated register (and thus the parameter associated with that dedicated register) in all the phases of each available flash memory operation. All the possible configuration values for each dedicated register 58 are stored in the configuration registers 52 for each dedicated register. The needed configuration values to be loaded into the dedicated registers may dynamically change during different phases of a flash memory operation, or across different operations, and the multiple available configuration values allow any needed configuration value to be easily loaded into a dedicated register during an operation, as described with reference to FIG. 4. Thus, there may be many more (M) configuration registers 52 than there are (N) dedicated registers 58.

In addition, a significant advantage of the present invention is that any or all of these configuration values can be easily changed by a tester or user during or after a debugging or development stage for the flash memory system 10 by programming fuses, or alternatively by writing new configuration values into the configuration registers, as described in greater detail below.

Fuses 54 are provided in the described embodiment of the present invention to allow configurability of the default configuration values stored in the configuration registers 52. Fuses 54 are settings that can be set or changed by a tester to influence operations of the flash memory system 10. For example, the fuses can include mask values stored in non-volatile memory cells, such as in flash memory array 16, and these mask values can be erased and/or programmed before or during testing. Typically, each fuse can be programmed with multiple possible mask values, e.g., as a binary number. The fuses 54 are associated with the configuration registers 52 such that the fuses can change the default configuration values stored in those configuration registers. By setting or changing the mask values of particular fuses, the tester can specify or change particular configuration values loaded to the dedicated registers 58. In the described embodiment, hardware logic of the flash memory system (not shown) combines the mask values from the fuses 54 with the default values stored in the configuration registers 52 to obtain the final configuration values that are loaded to dedicated registers 58 which are needed in a particular operation and phase of that operation. For example, the combination of mask values and default values can be a logical combination, such as AND or OR. Initially, the fuses 54 can store mask values that, when combined with the default configuration values in the configuration registers 52, do not change those default values, so that the default values are loaded into the dedicated registers 58.

Since the configuration values are typically very large in their possible ranges and their possible variations are in a small range around their expected (default) values, only a few bits of the configuration registers usually need to be configured. Therefore, the fuses 54 usually mask only a few bits of the configuration registers 52. Moreover, the same fuses can be used to mask more than one configuration register 52. Consequently, one embodiment of the invention includes configuration registers 52 which store fixed default values, and a fewer number of fuses 54, which can be easily and quickly programmed during testing modes.

In alternate embodiments, fuses 54 need not be used, and the values stored in the configuration registers 52 are the configuration values that are directly loaded into dedicated registers 58 without modification. The configuration registers 52 can be non-volatile, programmable storage locations. This allows configuration values to be directly changed, without the use of fuses, by programming a new configuration value in a configuration register 52.

A number of multiplexers 56 are provided in the system, one multiplexer for each dedicated register 58 that is wished to be programmed. Only one multiplexer is shown in FIG. 2, providing its output to a register 58, labelled "Dedicated Register 1." Each multiplexer is used to select one of the inputs to the multiplexer to pass a configuration value through to the output of the multiplexer. The multiplexer can be implemented as hardware in the flash memory system 10. At the inputs of each multiplexer 56 are the different configuration registers 52 storing the configuration values pertinent to the particular dedicated register 58 which is connected to the output of that multiplexer. When a LOAD opcode 60 is executed by the microcontroller 12, indicating the dedicated register 58, the address value 62 (operand) associated with the LOAD instruction is applied to the multiplexer 56 associated with the particular dedicated register 58 that is desired to be programmed. That multiplexer selects one of its inputs based on the address value 62, where the address value identifies one of the configuration registers 52. The selected input provides its configuration value to the multiplexer (which may, or may not, be a configuration value that has been modified by fuses 54), and the multiplexer passes the configuration value to its output to be loaded into the connected dedicated register 58. This causes the parameter associated with the loaded dedicated register to be initialized or updated, e.g., the value in the dedicated register 58 can be sent to charge pumps 20 to set a particular operating voltage or current for array 16, or set a different parameter related to flash memory operation.

Only one set of fuses 54, configuration registers 52, multiplexer 56, and dedication register 58 is shown in FIG. 2. In the described embodiment, this set of components is repeated for each dedicated register 58, such as dedicated register 2, dedicated register 3, etc., up to dedicated register N. Each dedicated register has its own fuses 54, configuration registers 52, and multiplexer 56.

Since the configuration values are easily configured by fuses stored in a programmable memory (and/or the configuration values are themselves easily programmable by being stored in an electrically erasable memory), these values can be easily changed, if a tester wishes, to change the configuration of the flash memory system, e.g., during debugging or testing of the flash memory. The address value, stored with the LOAD instruction in the ROM 14, need not be changed. This offers significant flexibility over the prior configuration methods, which stored the configuration value itself in the ROM 14, so that if the configuration value needed to be changed for debugging or other purposes, a new ROM mask had to be ordered to provide a new ROM, therefore costing significant time and resources which the present invention avoids.

In addition, since the fuses 54 are independent of the process that executes LOAD instructions and loads configuration values, much less program code is needed, i.e., there is no need to perform a compare operation to check the fuse settings before loading each configuration value, since the hardware logic automatically combines fuse mask values with values in the configuration registers 52 to create the configuration values.

FIG. 2 also shows a configuration value operand 64 being input to multiplexer 56. In some embodiments of the present invention, the configuration value operand 64 which should be loaded into a dedicated register 58 can be stored with the address operand 62 and with the LOAD instruction 64 in the ROM 14. Since some flash memory systems may not be compatible with the use of the addresses 62 as used in the present invention (e.g., there may be no set of configuration registers 52 providing configuration values), the configuration value operand 64 can be alternatively used in those systems instead of the address operand 62. Of course, value operand 64 has the same limitations of the prior art systems: it cannot be easily changed for debugging or other purposes, since it is stored in ROM 14 and requires a new ROM mask when it is altered.

In one example, one entire LOAD instruction of the present invention, stored in ROM 14, can have the format as follows: the LOAD opcode 60 provided in the highest bits, the address operand 62 provided in the middle bits, and the value operand 64 provided in the lower bits of the instruction. Other formats can also be used.

Figure 3:
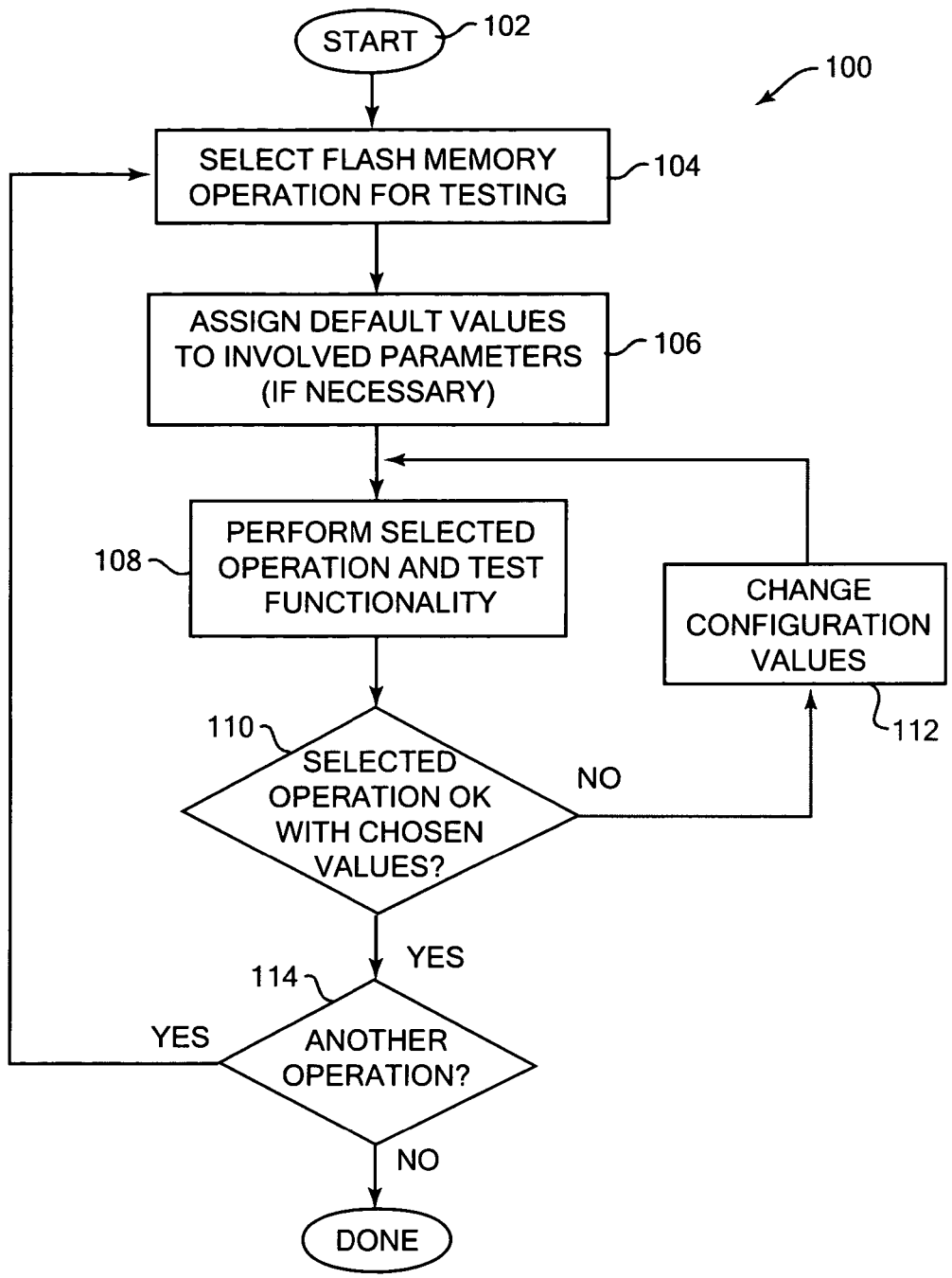
FIG. 3 is a flow diagram illustrating a method of the present invention for testing and debugging a flash memory system of FIGS. 1 and 2.

FIG. 3 is a flow diagram illustrating an example method 100 of the present invention for testing and debugging the operation of the flash memory system as described with reference to FIGS. 1 and 2. Method 100 is an example of a procedure that is performed during testing and debugging of the device ("testmode"), in which parameters are tested and configuration values possibly changed. During "normal operation" ("usermode") of the flash memory system 10 when flash memory operations are performed (usually after testing and debugging have been completed), no changing of configuration values is typically needed, since parameters have been adjusted to the desired levels in the testing process. Normal operation of the system is described below with reference to FIG. 4.

The method begins at 102, and in step 104, a particular flash memory operation is selected for testing. The particular flash memory operation can be selected in any number of ways. For example, the user/tester may have sent a command via a command user interface (CUI) to initiate a particular testing operation, such as a program command to write data to the flash memory array 16 in a program operation, or an erase command to erase data stored in the flash memory array 16 in an erase operation. Or, software testing code may have initiated a particular flash memory operation as part of a testing routine. The testing of the selected flash memory operation includes testing and debugging the parameters used for that operation.

In step 106, the default values are assigned to all parameters involved in the current operation, if necessary. Initially, default configuration values are already stored in the configuration registers 52, but the configuration values may have been changed in previous tests. In the described embodiment, the fuses 54 are thus set in this step with mask values that do not change the configuration values from their default values, if necessary.

In step 108, the selected operation is performed and the functionality of the operation is tested. Each operation of the flash memory, such as a program or erase operation, includes a number of different operation phases that are performed, as is well known to those of skill in the art. The testing process knows which configuration register 52 to select for each parameter of each phase of the operation, so that the proper configuration values are loaded through appropriate multiplexers 56 into the dedicated registers to control the parameters of the flash memory system. The testing process monitors the results of the testing, e.g., voltages, currents, outputs, or other characteristics can be monitored to determine if the operation conforms to desired specifications.

In step 110, the process checks whether the selected operation performs correctly with the chosen configuration values for the parameters, i.e., whether the operation is within desired specifications. The process can compare the actual operation results with the desired results. If the configuration values did not produce the desired performance, then the process continues to step 112, in which appropriate configuration values are changed to different values in an attempt to bring the performance closer to desired specifications. For example, in the described embodiment, configuration values can be changed by changing the mask values of particular fuses 54 in their stored locations. The particular changes made can depend on the operation performed, how much the tested performance deviated from the desired performance, etc. In other embodiments without fuses 54, configuration values may be changed directly by writing a new value to the configuration registers 52. In either case, an advantage of the invention is that no ROM data need be changed to change the configuration values, since the testing process is independent of data stored in the ROM.

After one or more configuration values are changed, the process returns to step 108 to perform the same operation with the new configuration values to see how closely it performs to desired specifications. If the performance is still not within desired constraints, then configuration values can be changed further in step 112. Thus, the performance of the flash memory system 10 can be iteratively adjusted.

If the selected operation performed within desired specifications as determined in step 110, then the process continues to step 114 to check whether there is another operation to be tested. If so, the process returns to step 104 to select another operation for testing and debugging. If there are no more operations to be tested at step 114, then the process is complete at 116. Alternatively, the process can select a different type of test for the current operation.

Figure 4:
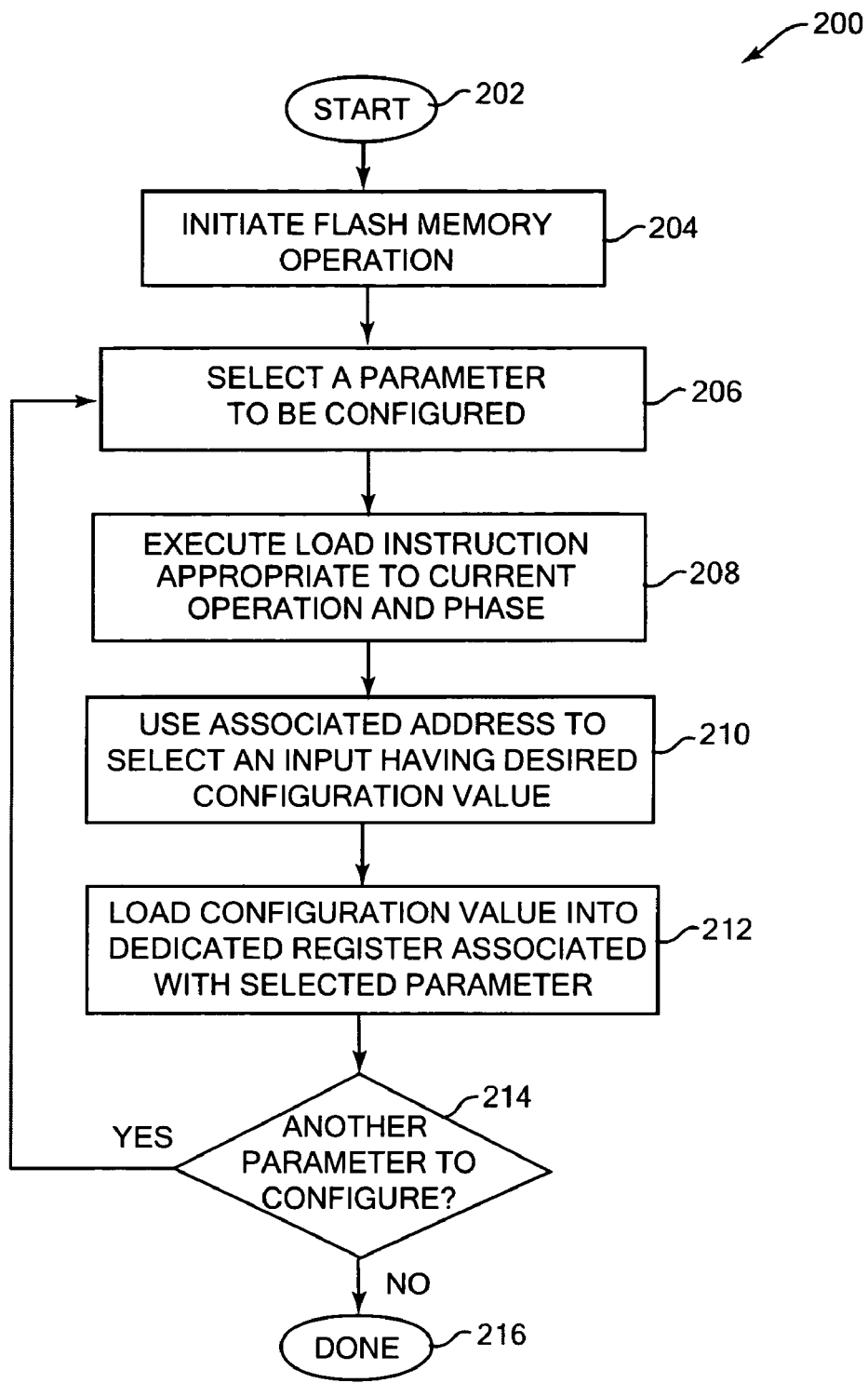
FIG. 4 is a flow diagram illustrating a method of the present invention for configuring parameters for an operation of a flash memory device.

FIG. 4 is a flow diagram illustrating a method 200 of the present invention for configuring parameters for an operation of flash memory. Method 200 is an example of a procedure that is performed during normal operation ("user-mode") of the flash memory system 10, after testing and debugging have been completed. No changing of configuration values in registers 52 is needed in this process, since they have been adjusted to desired values in the testing and debugging process of FIG. 3 to achieve performance within desired specifications. Particular described instructions, such as the LOAD instructions for loading configuration values, are originally stored in ROM 14 and retrieved by the microcontroller 12 to be executed and implemented.

The method begins at 202, and in step 204, a particular flash memory operation is initiated. A particular flash memory operation can be initiated during normal operation in any number of ways, e.g., from software code running by the processor. Or the user may have sent a command via a command user interface (CUI) to initiate a particular operation, such as a program command to write data to the flash memory array 16 in a program operation, or an erase command to erase data stored in the flash memory array 16 in an erase operation.

In step 206, one of the parameters is selected that is to be configured for use with the flash memory operation (each flash memory operation may involve multiple parameters). For example, the selected parameter can be a device signal voltage or current (based on charge pump output), a timing parameter, a start value, a maximum value, etc. In step 208, a selected LOAD instruction 60 of the ROM code is executed (this instruction can be retrieved currently, or may have been earlier retrieved from the ROM). As explained above, this LOAD instruction is appropriate to the desired parameter that was selected to be configured in step 206, and is also appropriate to the current phase of the flash memory operation. Each operation of the flash memory, such as a program or erase operation, includes a number of different operation phases, as is well known to those of skill in the art. By knowing the current phase of the operation, as well as the type of operation, the process knows which LOAD instruction to execute.

In step 210, the address operand 62 for the executed LOAD instruction is provided to configuration system 18 from ROM 14 and is used to select one of the inputs to a particular multiplexer 56, where the selected input of the multiplexer provides the desired configuration value needed for the selected parameter, as described above with reference to FIG. 2. In a described embodiment, the value in the selected configuration register 52 is combined with a mask value from its associated fuse 54 by hardware logic of the flash memory system 10 to obtain the configuration value provided to the selected input of the multiplexer 56.

In step 212, the configuration value of the selected input is loaded into the dedicated register 58 coupled to the output of the multiplexer 56, which configures the parameter selected in step 206. This dedicated register 58 is associated with the selected parameter, where each dedicated register 58 of the flash memory system is associated with a particular parameter. The configuration value loaded in the dedicated register can, for example, provide a start value for a memory cell voltage, a maximum value for a voltage, or other parameter; or, the loaded value can update an existing parameter if it is currently a new phase of the flash memory operation and the new phase requires a different value. For example, the configuration value loaded in the dedicated register (the dedicated value) can be provided to the charge pumps 20 to regulate voltage parameters of the array 16.

In step 216, the process checks whether there is another parameter to configure for the flash memory operation. If so, the process returns to step 206 to select a different parameter, and to load another configuration value to the associated dedicated register 58 similarly as explained in the steps above. Once there are no other parameters to configure at step 116, then the process is complete at 216.

It should be noted that the above method of the present invention does not need to check the status of any of the hardware fuses 54 during the process of loading configuration values into dedicated registers. The method of the present invention knows the current phase and operation of the flash memory that is associated with an executed load instruction and address, and can load the value stored in the configuration register associated with the address. The fuses, if programmed, are done so outside the steps of performing the flash memory operation as described in method 200. The method thus does not have to read the fuses every time configuration values are loaded to determine what values should be loaded, as was the case in prior implementations. No compare or jump instructions are needed to check fuses just prior to loading configuration values in the present invention. The present invention therefore saves time and requires less code instructions when configuring flash memory parameters.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for configuring parameters for a flash memory, the method comprising:
   retrieving a load instruction and an associated address from a read-only memory;
   using the address to select a configuration register storing a configuration value; and
   loading the configuration value to a dedicated register in the flash memory to configure an associated parameter of the flash memory in a flash memory operation.

2. The method of claim 1 wherein the address is used to select a configuration register from a plurality of configuration registers using a multiplexer.

3. The method of claim 1 further comprising storing the configuration values required for all possible flash memory operations in a plurality of configuration registers.

4. The method of claim 1 wherein the configuration value stored in the configuration register is a default configuration value, and wherein a configuration value different from the default configuration value can be loaded to the dedicated register by programming a hardware fuse associated with the configuration register.

5. The method of claim 4 wherein the hardware fuse includes a mask value stored in a memory location or other storage location, wherein the mask value is combined with the default configuration value stored in the configuration register to obtain the configuration value loaded to the dedicated register.

6. The method of claim 1 wherein a plurality of load instructions and addresses are available to be used, each address pointing to a different configuration register holding a different configuration value.

7. The method of claim 6 further comprising selecting the load instruction and address that is appropriate to the flash memory operation.

8. The method of claim 7 further comprising selecting the load instruction that is appropriate to a current phase of the flash memory operation.

9. The method of claim 3 wherein the plurality of configuration registers are erasable and programmable so that configuration values stored in the configuration registers can be changed.

10. The method of claim 1 wherein the parameter of the flash memory that is controlled is a cell gate voltage start value for a program operation.

11. The method of claim 1 wherein the parameter of the flash memory that is controlled is a cell source voltage start value for an erase operation.

12. The method of claim 1 wherein the configuration value is also stored with the load instruction and address in the read-only memory, wherein the configuration value in the read-only memory can be loaded into the dedicated register directly from the read-only memory in a system not compatible with the use of the address value.

13. A system for configuring parameters for a flash memory, the system comprising:
   a microcontroller;
   a read-only memory coupled to the microcontroller and storing a plurality of addresses, wherein each of the addresses points to a configuration register, each configuration register storing a configuration value;
   a flash memory array coupled to the microcontroller, the flash memory array including a plurality of programmable memory locations; and
   a plurality of dedicated registers associated with the flash memory array, wherein to configure a parameter of the flash memory in a flash memory operation, one of the configuration values is loaded into one of the dedicated registers, wherein the loaded configuration value is from a configuration register pointed to by a particular one of the addresses stored in the read-only memory, the particular address associated with the parameter.

14. The system of claim 13 wherein the read-only memory stores a load instruction associated with each of the addresses and executed to load the configuration value.

15. The system of claim 14 further comprising a multiplexer coupled to each of the dedicated registers, wherein a selected multiplexer selects the configuration register pointed to by the address associated with the executed load instruction.

16. The system of claim 13 wherein the stored configuration values are required for all possible flash memory operations of the flash memory device.

17. The system of claim 13 wherein the configuration values stored in the configuration registers are default configuration values, and wherein configuration values different from the default configuration values can be loaded to the dedicated registers by programming hardware fuses coupled to and associated with the configuration registers.

18. The system of claim 17 wherein the hardware fuses each include a mask value stored in a memory location or other storage location, wherein the mask value is combined with the default configuration value stored in a configuration register to obtain a configuration value loaded to a dedicated register.

19. The system of claim 13 wherein the configuration registers are provided as erasable and programmable memory locations such that configuration values stored in the configuration registers can be changed.

20. The system of claim 13 wherein each address points to a different configuration register, each configuration register holding a different configuration value.

21. The system of claim 14 wherein the microcontroller selects a load instruction and address that is appropriate to the flash memory operation, and is appropriate to a current phase of the flash memory operation.

22. The system of claim 13 wherein the parameter of the flash memory that is configured is a cell gate voltage start value for a program operation.

23. The system of claim 13 wherein the parameter of the flash memory that is configured is a cell source voltage start value for an erase operation.

24. A method for testing parameters for a flash memory operation, the method comprising:

selecting configuration registers not provided in a read-only-memory (ROM) device, wherein the selected configuration registers each store a selected configuration value, and loading the selected configuration values to dedicated registers of a flash memory to configure associated parameters of the flash memory in the flash memory operation;

determining whether the flash memory operation is within desired specifications; and changing at least one of the selected configuration values loaded to the dedicated registers if the flash memory operation is not within desired specifications.

25. The method of claim 24 wherein the changing at least one of the selected configuration values includes programming at least one fuse.

26. The method of claim 25 wherein programming at least one fuse includes changing a mask value of a fuse and combining the mask value with a default configuration value stored in the selected configuration register to obtain the at least one changed configuration value.

27. The method of claim 24 wherein the configuration registers are provided as erasable and programmable memory locations such that the changing of at least one of the selected configuration values includes directly changing the at least one selected configuration value in the configuration register.

* * * * *